(12) United States Patent
Sasaki (10) Patent No.: US 6,433,591 B2
(45) Date of Patent: Aug. 13, 2002

(54) FREQUENCY-VOLTAGE CONVERSION CIRCUIT AND RECEIVING APPARATUS

(75) Inventor: Teruo Sasaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/757,793

(22) Filed: Jan. 11, 2001

Related U.S. Application Data (62) Division of application No. 09/450,331, filed on Nov. 29, 1999.

(51) Int. Cl.[7] ................................................ H03D 3/00
(52) U.S. Cl. ...................................... 327/102; 327/336
(58) Field of Search ................................. 327/102, 336, 327/337, 341, 345; 330/9

(56) References Cited

U.S. PATENT DOCUMENTS

| | | | |
|---|---|---|---|
| 4,383,230 A | * 5/1983 | Manzolini | 327/552 |
| 4,469,082 A | * 9/1984 | Nishitoba et al. | 327/172 |
| 4,675,580 A | * 6/1987 | Dietz | 327/125 |
| 5,757,219 A | * 5/1998 | Weedon et al. | 327/307 |
| 6,118,984 A | 9/2000 | Yu-Hong et al. | |

FOREIGN PATENT DOCUMENTS

| | | |
|---|---|---|
| JP | 10-163877 | 6/1998 |

* cited by examiner

*Primary Examiner*—Kenneth B. Wells
(74) *Attorney, Agent, or Firm*—Scully, Scott, Murphy & Presser (57) ABSTRACT

In a frequency-voltage conversion circuit, integrating means gives a predetermined slope for rising or falling of a rectangular pulse signal. First comparing means compares an output value of the integrating means with a threshold value, and produces a pulse signal line having a pulse width corresponding to frequency of the rectangular pulse signal. Storing means stores and retains the threshold value. Smoothing means smooths the pulse signal line, and produces a voltage value corresponding to the frequency of the rectangular pulse signal. Second comparing means compares the voltage value with a reference voltage, and charges and discharges electric charge for the storing means on the basis of the comparison result.

8 Claims, 11 Drawing Sheets

FREQUENCY-VOLTAGE CONVERSION CIRCUIT AND RECEIVING APPARATUS

CROSS REFERENCE TO RELATED APPLICATION

The present application is a divisional of copending application Ser. No. 09/450,331 filed on Nov. 29, 1999.

BACKGROUND OF THE INVENTION

This invention relates to a frequency-voltage conversion circuit and a receiving apparatus applicable for a direct conversion receiver which receives and demodulates a FSK Frequency Shift Keying) signal.

A superheterodyne method and a direct conversion method are generally used in a FSK (Frequency Shift Keying) receiver. In each method, demodulation is carried out by the use of the known F-V (Frequency-Voltage) conversion.

Figure 1:
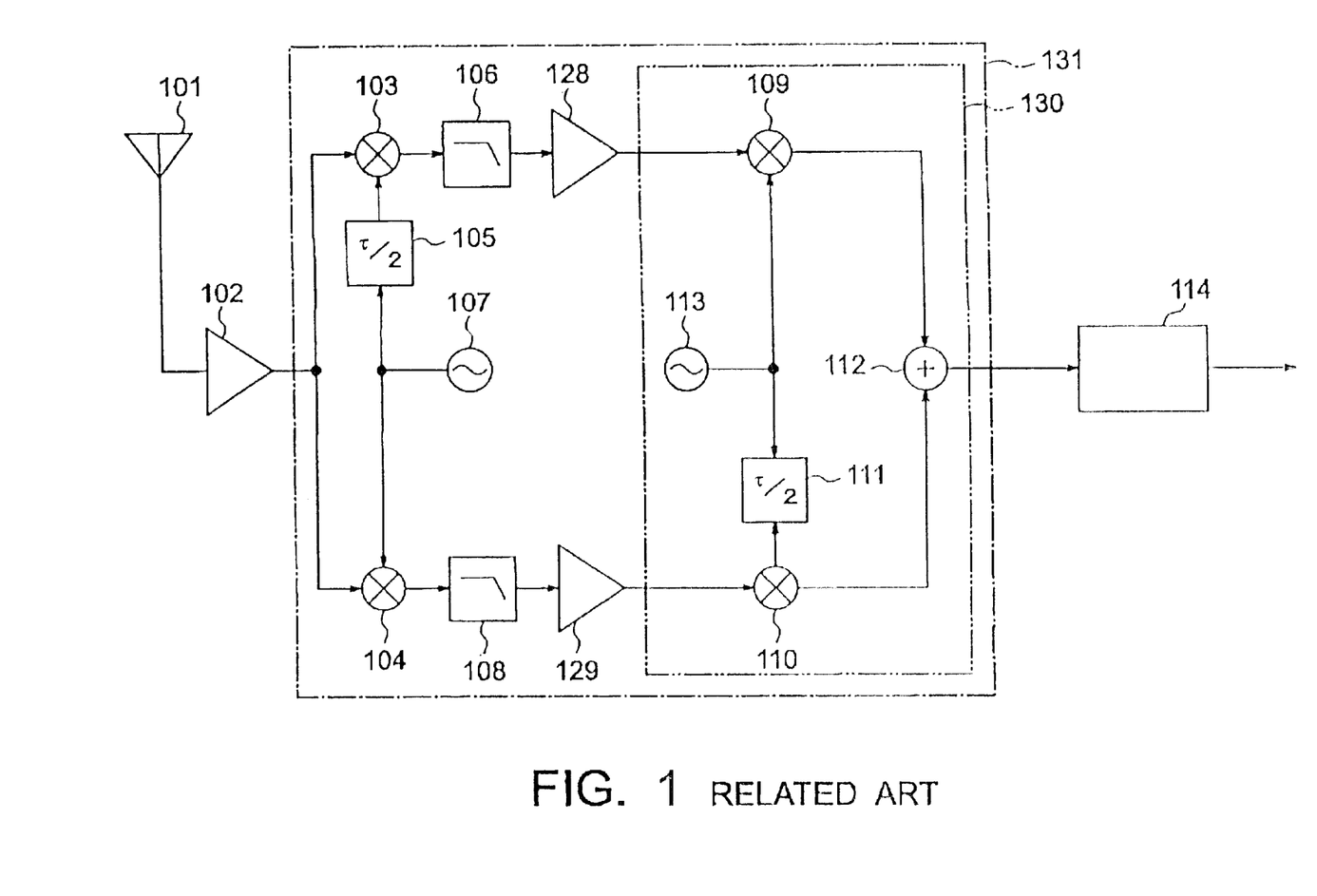
FIG. 1 is a block diagram showing a related direct conversion receiver using F-V conversion.

Referring to FIG. 1, description will be made about a related direct conversion receiver using the F-V conversion.

In a Weber receiver illustrated in FIG. 1 the direct conversion receiver, a base-band cross signal is brought up to intermediate frequency (namely, up-conversion is conducted), and the F-V conversion is performed.

The FSK signal sent from a receiver (not shown) is received by an antenna 101, is amplified by a high frequency amplifier 102, and is given to mixers 103 and 104, respectively.

A local oscillator 107 produces an oscillation signal. The oscillation signal is shifted with $\pi/2$ by the use of a $\pi/2$ shifter 105, and is given to the mixer 103. Further, the frequency signal from the local oscillator 107 is directly given to the mixer 104.

Low pass filters (hereinafter, abbreviated as LPFs) 106 and 108 are connected to the mixers 103 and 104, respectively. In this condition, output signals from the mixers 103 and 104 are given to the LPSs 106 and 108, respectively.

Each of the LPFs 106 and 108 has passing band equivalent to the base band signal, and realizes or obtains selectivity between adjacent channels. Further, the LPFs 106 and 108 supply output signals corresponding to signals from the mixers 103 and 104 into an up-conversion portion 130.

In this case, the up-conversion portion 130 is composed of mixers 109 and 110, a local oscillator 113, a $\pi/2$ shifter, and an adder 112, as illustrated in FIG. 1.

With this structure, the mixer 109 is given with an oscillation signal from the local oscillator 113. Further, the oscillation signal from the local oscillator 113 is shifted with $\pi/2$ by a $\pi/2$ shifter 111, and is given to the mixer 110.

Signals multiplied by the mixers 109 and 110 are added by the adder 112 Alternatively, the multiplied signals may be subtracted by a subtracter (not shown). An output signal of the adder 112 is converted by the use of a delay detection portion 114.

In the above-mentioned Weber receiver 131, a carrier wave frequency of the received FSK signal is defined as $\omega/2\pi$ while frequency deviation is defined as $\pm\Delta\omega/2\pi$. In this condition, the received FSK signal $Sr_{FSK}$ is represented by the following equation.

$$Sr_{FSK} = \cos(\omega \pm \Delta\omega)t$$

In this event, when the output signal $S_{OSC1}$ of the local oscillator 107 is defined as $S_{OSC1} = \sin \omega t$, the output signals $S_{MIX3}$ and $S_{MIX4}$ of the mixers 103 and 104 are represented by the following equations, respectively.

$S_{MIX3} = \cos(\omega \pm \Delta\omega)t \cdot \cos \omega t = \frac{1}{2}\{\cos(\omega \pm \Delta\omega + \omega)t + \cos(\omega \pm \Delta\omega - \omega)t\} = \frac{1}{2}\{\cos(2\omega \pm \Delta\omega)t + \cos(\pm\Delta\omega t)\}$ $S_{MIX4} = \cos(\omega \pm \Delta\omega)t \cdot \sin \omega t = \frac{1}{2}\{\sin(\omega \pm \Delta\omega + \omega)t + \sin(\omega \pm \Delta\omega - \omega)t\} = \frac{1}{2}\{\sin(2\omega \pm \Delta\omega)t + \sin(\pm\Delta\omega t)\}$ First terms of these equations are removed by the LPFs 106 and 108. Therefore, the outputs $S_{LPF6}$ and $S_{LPF8}$ of the LPFs 106 and 108 are represented by the following equations.

$$S_{LPF6} = \frac{1}{2}\{\cos(\Delta\omega t)\} \quad (1)$$

$$S_{LPF8} = \pm\frac{1}{2}\{\sin(\Delta\omega t)\} \quad (2)$$

In this case, when calculation is carried out without limiter amplifiers 128 and 129 so as to be readily understood, an output signal Vout of the up-conversion portion 130 is modified as follows. Herein, it is to be noted that the output signal of the local oscillator 113 is defined by $S_{OSC2} = \sin \omega 2t$.

$$Vout = \frac{1}{2}\{\cos(\Delta\omega t)\sin \omega 2t)\} \pm \frac{1}{2}\{\sin(\Delta\omega t)\cos \omega 2t)\} = \frac{1}{2}\{\sin(\omega 2 \pm \Delta\omega)t\}$$

From the above-mentioned result, the base band signal I, Q is converted to a signal having frequency deviation of $\pm\Delta\omega/2\pi$ when the intermediate frequency $\omega2/2\pi$ is defined as a center.

Subsequently, when the limiter amplifiers 128 and 129 are inserted between the LPF 106 and the mixer 109 or between the LPF 108 and the mixer 110, the condition is explained as follows.

When inputs into the mixers 109 and 110 becomes rectangular wave by the limiter amplifiers 128 and 129, outputs $S_{LPF6'}$ and $S_{LPF8'}$, are modified as follows by Fourier transforming the above-mentioned equations (1) and (2) Herein, it is to be noted that constant is defined as $k=2/\pi$.

$S_{LPF6'} = k\{\cos(\Delta\omega t) + \frac{1}{3}\cdot\cos(3\Delta\omega t) + \frac{1}{5}\cdot\cos(5\Delta\omega t) + \ldots\}$ (1')

$S_{LPF8'} = k\{\sin(\omega 2 \pm \omega)t + \frac{1}{3}\cdot\sin(3(\omega 2 \pm \Delta\omega)t + \frac{1}{5}\cdot\sin(5(\omega 2 \pm \Delta\omega)t) + \ldots\}$ (2')

Namely, the output Vout' of the up-conversion portion 130 is similarly considered to be the modification of the above-mentioned equation (3). Thereby, the following equation is introduced.

Vout=$k\{\sin(\omega 2 \pm \omega) \ t + \frac{1}{3}\cdot\sin(3(\omega 2 \pm \Delta\omega)t + \frac{1}{5}\cdot\sin(5(\omega 2 \pm \Delta\omega)t) + \ldots\}$ (3')

Consequently, it is found out that the conversion-up becomes possible even when the limiter amplifiers 128 and 129 are inserted between the LPF 106 and the mixer 109 or between the LPF 108 and the mixer 110.

Although the Weber receiver 131 has been suggested as a SSB (Single Side Band) receiver, it is found out that the Weber receiver 131 is applicable as the FSK receiver, as explained above.

The output signal of the adder 112 is given to the delay detection portion 114, and the F-V conversion is carried out in the delay detection portion 114.

Figure 2:
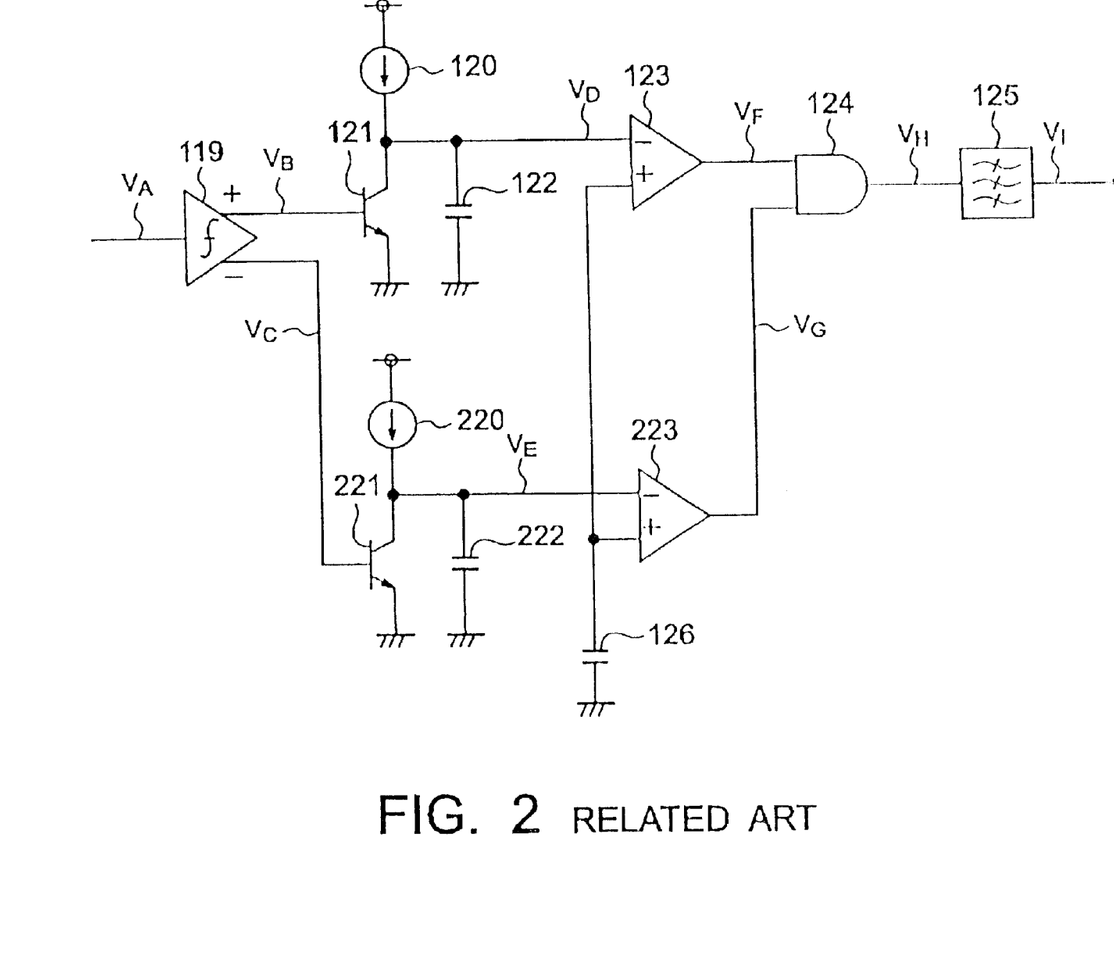
Fig. 2 is a connection diagram showing a detail structure of the delay detection portion 114 illustrated in FIG. 1.
Figure 3:
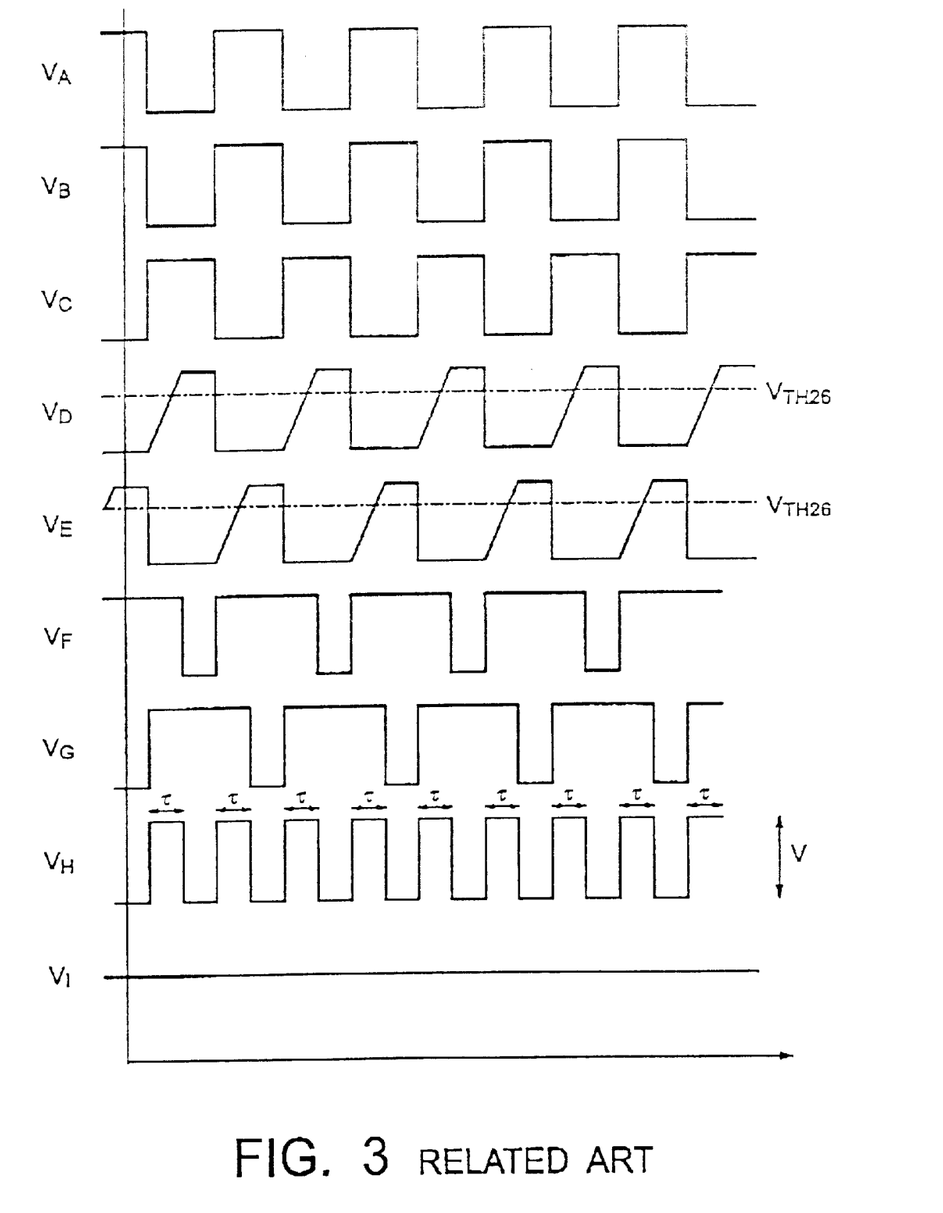
FIG. 3 is a timing chart showing change (waveform) of each signal of each portion in the delay detection portion 114 illustrated in FIG. 1.

In FIG. 2, a detail structure of the delay detection portion 114 is illustrated. Further, a timing chart showing change (waveform) of each signal of each portion in the delay detection portion 114 is illustrated in FIG. 3.

A signal $V_A$ from the adder 112 is converted into output signals $V_B$ and $V_C$ by removing amplitude demodulation components by the use of a limiter amplifier 119.

Subsequently, the output signals $V_B$ and $V_C$ are converted into signals $V_D$ and $V_E$ having desired slopes at rising through common-emitter transistors 121 and 221. Further, the signals $V_D$ and $V_E$ are converted into signals $V_F$ and $V_G$ by comparators 123 and 223 given with threshold level $V_{TH26}$ from a reference voltage 126.

In this event, the transistors 121 and 221 are coupled to constant current sources 120, 220 and capacitors 122, 222, respectively.

Moreover, the signals $V_F$ and $V_G$ are converted into a signal $V_H$ via an AND gate (namely logical product). Thereby, pulse signal line, which has constant amplitude and constant delay time τ, is formed, as illustrated in FIG. 3.

Finally, the pulse signal line $V_H$ is integrated by a LPF 125, and converted into a voltage value $V_I$ corresponding to frequency. Further, the obtained voltage $V_I$ is converted into a logic data signal consisting of "1" and "0" by a converter (not shown).

Figure 4:
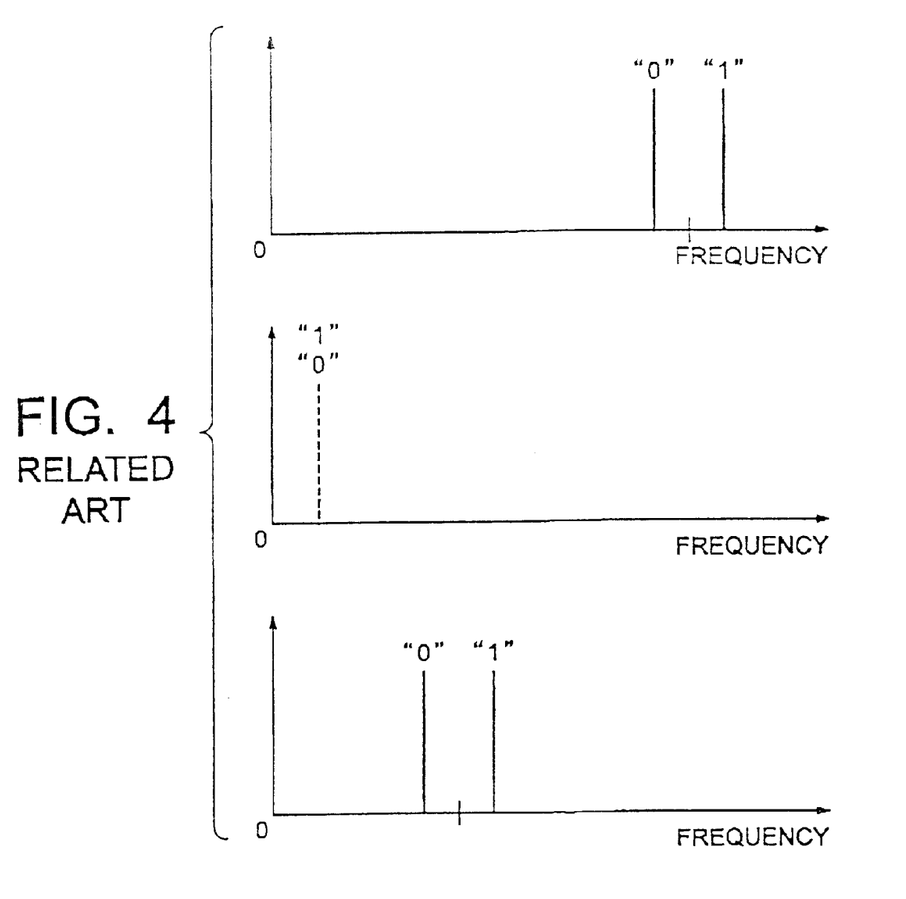
FIG. 4 is diagram showing frequency spectrums for explaining function of the direct-conversion receiver.

In FIG. 4, frequency spectrums are illustrated so as to explain the above-mentioned structure. In an intermediate stage in the FIG. 4, center frequency between frequency of "1" and frequency of "0" becomes carrier wave frequency.

Figure 5:
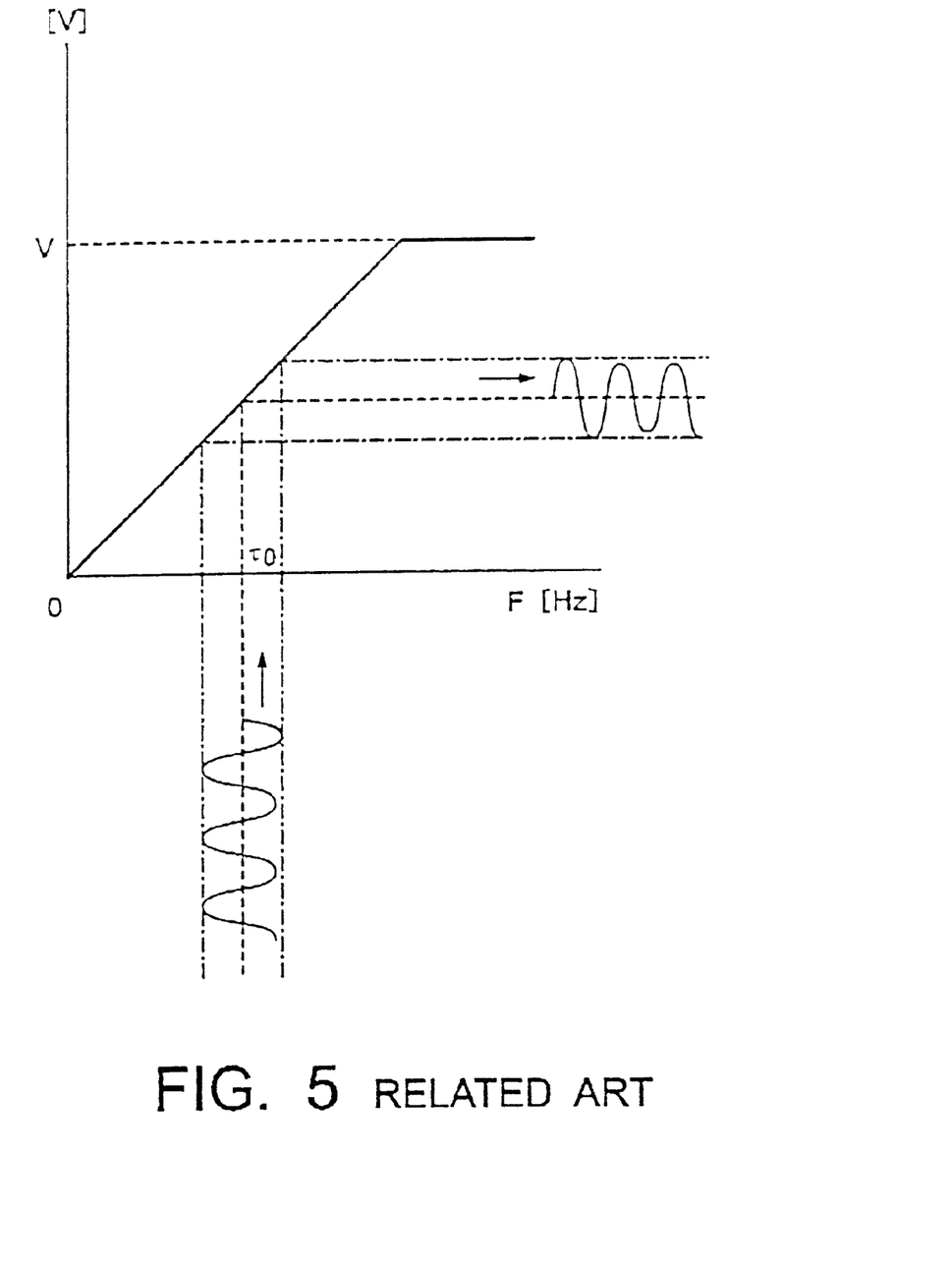
FIG. 5 is a characteristic diagram showing characteristic obtained by the delay detection portion 114 illustrated in FIG. 1.

In FIG. 5, characteristic obtained the delay detection portion 114 is illustrated. In the above-mentioned example, demodulation sensitivity KD is defined as KD=2τ V [V/Hz]. Consequently, the characteristic is affected by variation of τ and V. Herein, it is to be noted that τ represents delay time while V indicates output amplitude of the signal $V_H$.

Moreover, the delay time τ is inversely proportional to variation of the constant current sources 120 and 220 illustrated in FIG. 2, and is proportional to variation of static capacitance of the capacitors 122 and 222. Further, the delay time τ is proportional to the threshold voltage $V_{TH26}$.

Specifically, the demodulation sensitivity is fluctuated by variation of manufacturing condition. In addition, Further, F-V conversion output amplitude is varied in the direct-conversion method using the F-V conversion. As a result, receiving condition may be deteriorated.

Further, the power supply voltage is restricted from the same reason, and reneality of the F-V conversion is degraded. In consequence, receiving condition is also degraded.

SUMMARY OF THE INVENTION

It is therefore an object of this invention to provide a frequency-voltage conversion circuit which is capable of correcting manufacturing variation and change with time caused by the variation.

It is another object of this invention to provide a frequency-voltage conversion circuit which is capable of demodulating a FSK signal with stable and high sensitivity and linearity.

In a frequency-voltage conversion circuit according to this invention, integrating means gives a predetermined slope for rising or falling of a rectangular pulse signal.

First comparing means compares an output value of the integrating means with a threshold value, and produces a pulse signal line having a pulse width corresponding to frequency of the rectangular pulse signal.

Storing means stores and retains the threshold value. Smoothing means smooths the pulse signal line, and produces a voltage value corresponding to the frequency of the rectangular pulse signal.

Second comparing means compares the voltage value with a reference voltage, and charges and discharges electric charge for the storing means on the basis of the comparison result.

In this case, the integrating means comprises a constant current device which produces constant current, and a static capacitance device which stores the current.

With such a structure, the second comparing means discharges the electric charge from the storing means when the voltage value is higher than the reference voltage.

On the other hand, the second comparing means charges electric charge for the storing means when the voltage value is lower than the reference voltage.

DESCRIPTION OF PREFERRED EMBODIMENTS

Hereinafter, description will be made about embodiments of this invention with drawings.

First Embodiment

Figure 6:
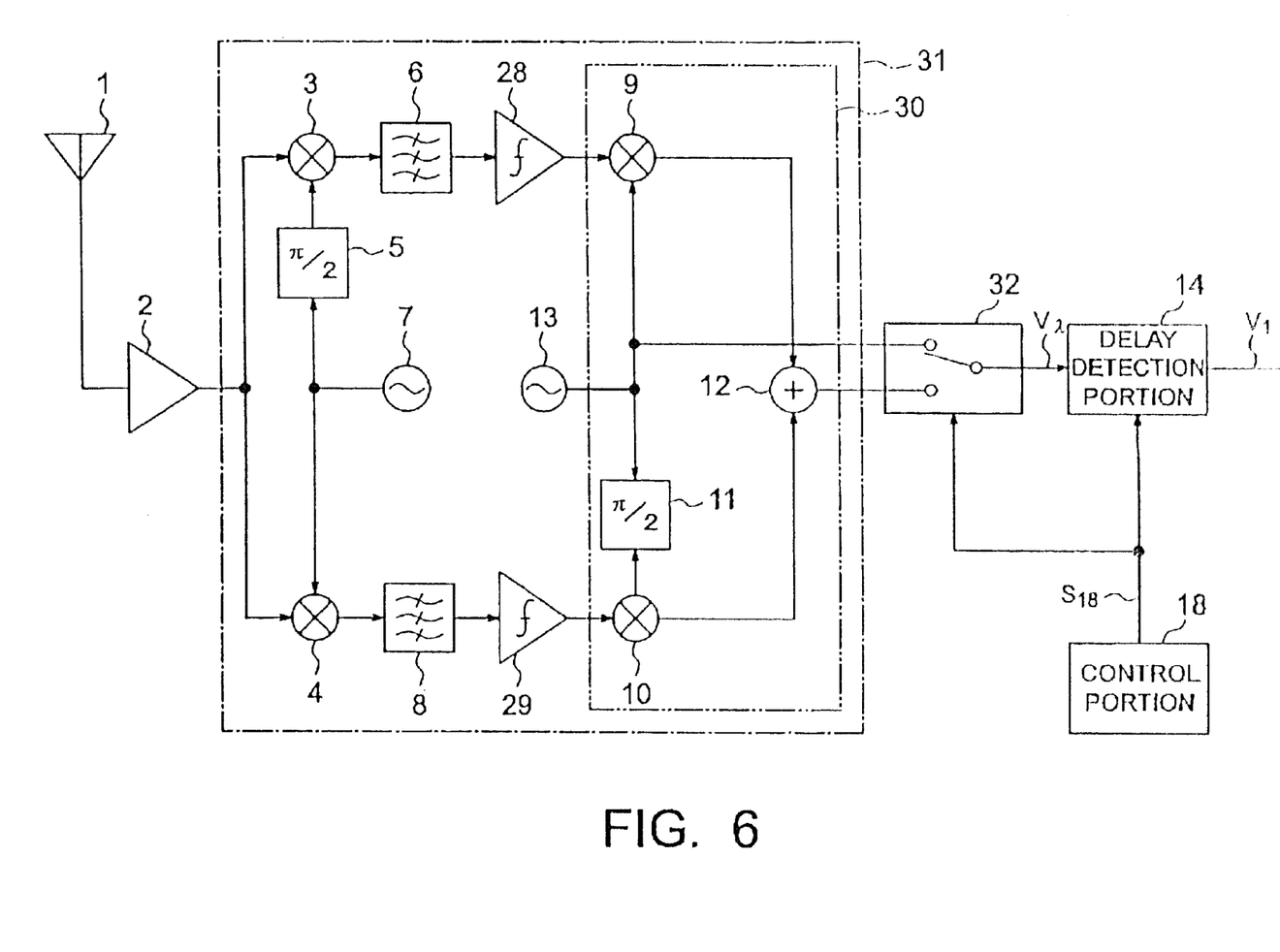
FIG. 6 is a block diagram showing a structure of a receiver according to a first embodiment of this invention.

Referring to FIG. 6, description will be made about a first embodiment of this invention.

A FSK (Frequency Shift Keying) signal transmitted from a transmitter (not shown) is received via an antenna 1, is amplified by a high-frequency amplifier 2, and is given to mixers 3 and 4, respectively.

An oscillation signal from a local oscillator 7 is shifted with 2/π by a 2/π shifter 5. The shifted signal is given to the mixer 3 while the oscillation signal from the local oscillator 7 is directly given to the mixer 4.

The mixers 3 and 4 are connected to LPFs (Low Pass Filters) 6 and 8 as channel filters, respectively. Output signals of the mixers 3 and 4 are given to the LPFs 6 and 8.

Each of the LPFs 6 and 8 has passing band equivalent to a base band signal, and realizes or obtains selectivity between adjacent channels. Further, the LPFs 6 and 8 supply output signals corresponding to signals from the mixers 3 and 4 into an up-conversion portion 30.

The up-conversion portion 30 is composed of a mixer 9, a mixer 10, a local oscillator 13, a 2/π shifter 11, and an adder 12. The mixer 9 is given with an oscillation signal from the local oscillator 13. On the other hand, the oscillation signal from the local oscillator 13 is shifted with $2/\pi$ by the $2/\pi$ shifter 5. The shifted signal is given to the mixer 10.

Signals multiplied by the mixers 9 and 10 are added by the use of an adder 12. Alternatively, the multiplied signals may be subtracted by a subtracter (not shown).

The reference numeral 32 represents a switch which switches a signal obtained by a Weber receiver 31 with an output signal of the local oscillator 13. The reference numeral 14 indicates a delay detection portion which F-V converts an output signal of the switch 32. Further, the reference numeral 18 represents a control portion which controls the switch 32 and the delay detection portion 14.

The switch 32 gives the output signal of the local oscillator 13 into the delay detection portion 14 when a control signal $S_{18}$ is put into "H" (high level). On the other hand, the switch 32 gives the output signal of the adder 12 into the delay detection portion 14 when the control signal S18 is put into "L" (low level).

Figure 7:
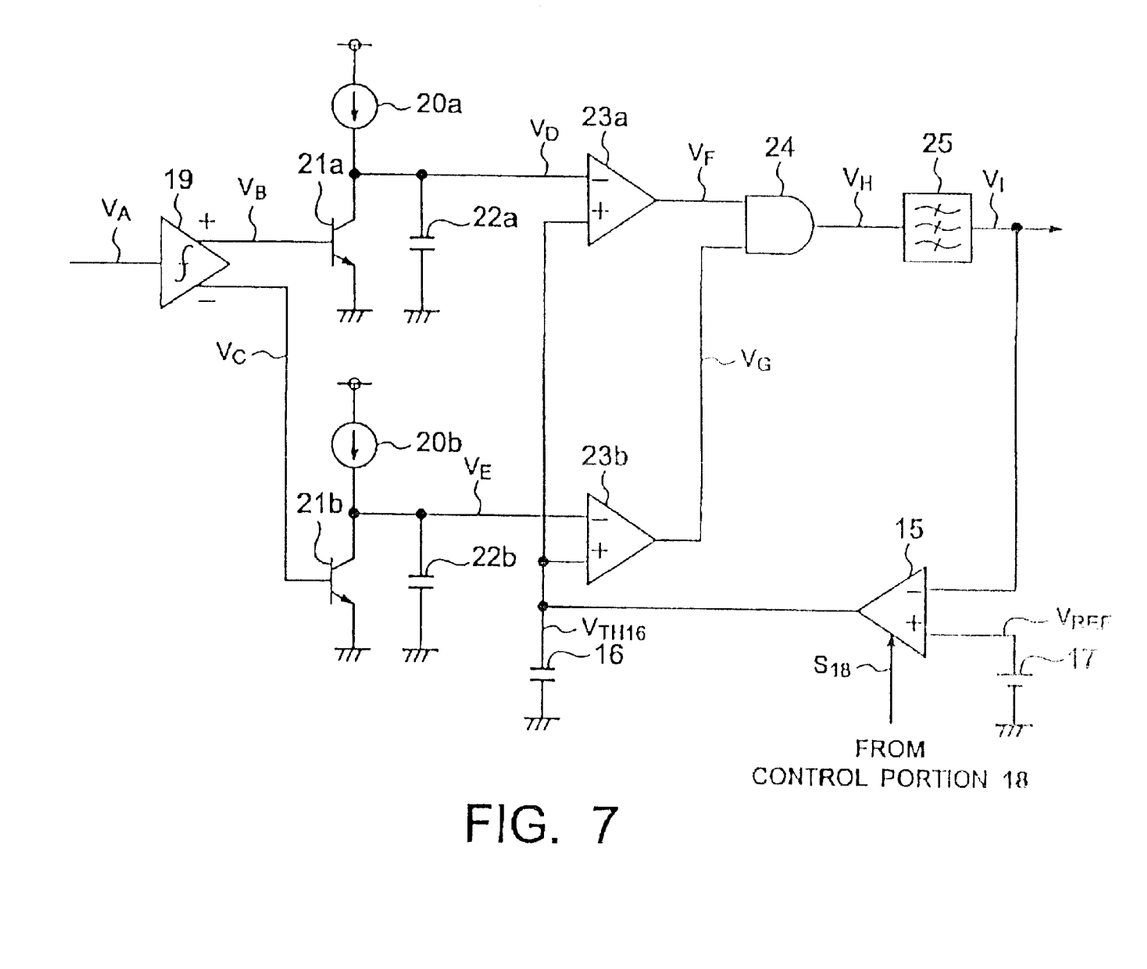
FIG. 7 is a connection diagram showing a detail structure of the delay detection portion 14 illustrated in FIG. 6.

In FIG. 7, a signal $V_A$ (rectangular pulse signal) from the above adder 12 is removed amplitude modulation components thereof by a limiter amplifier 19, and is converted into output signals $V_B$ and $V_C$ respectively.

Subsequently, the output signals $V_B$ and $V_C$ are converted into signals $V_D$ and $V_E$ having desired slopes at rising through common-emitter transistors 21a and 21b. Herein, it is to be noted that each of the signals $V_D$ and $V_E$ may have the slope at falling.

Further, the signals $V_D$ and $V_E$ are converted into signals $V_F$ and $V_G$ by comparators 23a and 23b.

In this event, the transistors 21a and 21b are coupled to constant current sources 20a, 20b and capacitors 22a, 22b, respectively. The comparators 23a and 23b are coupled to a capacitor 16, and is given with an output signal of a VI amplifier 15.

Figure 8:
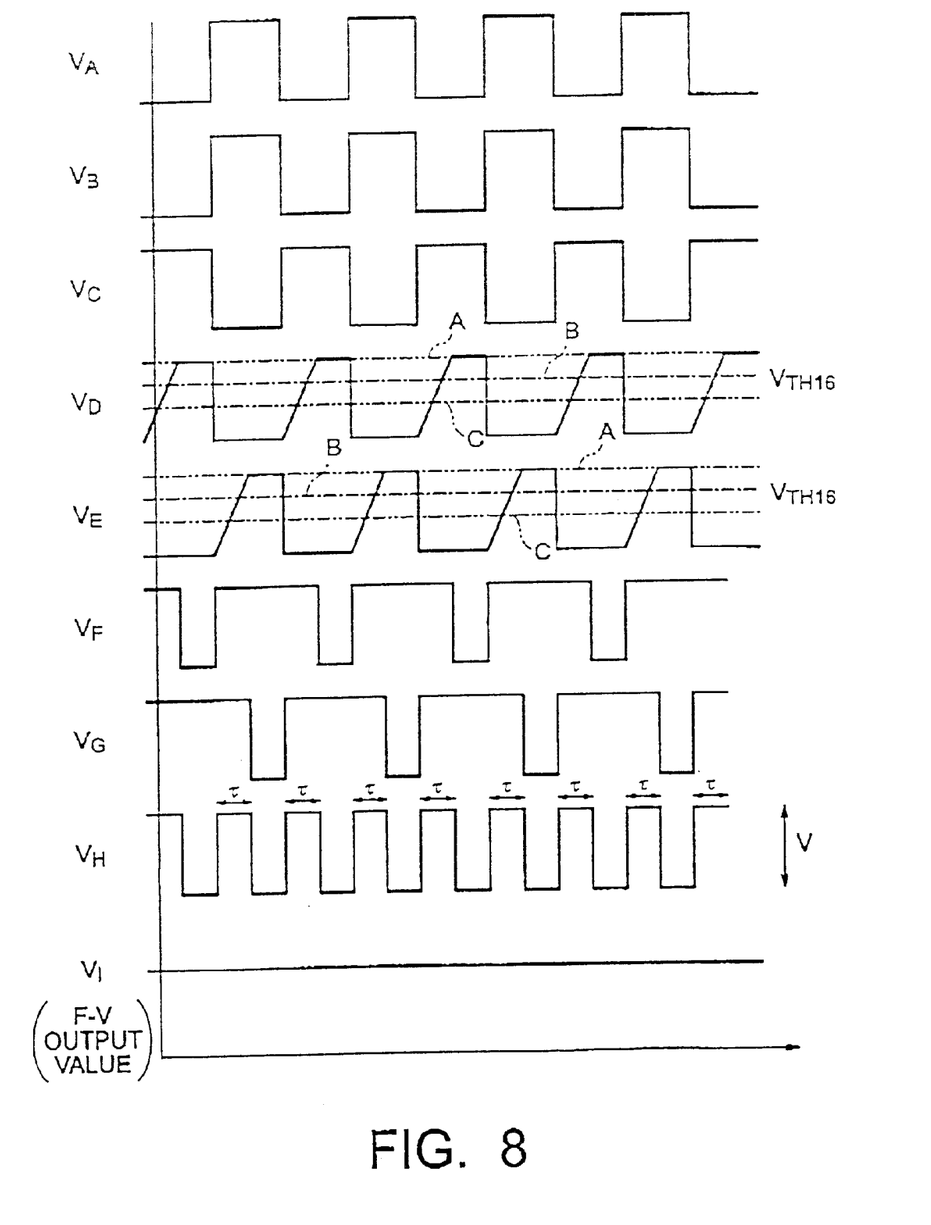
FIG. 8 is a timing chart showing change (waveform) of each signal of each portion in the delay detection portion 14 illustrated in FIG. 6.

Further, the signals $V_F$ and $V_G$ are converted into a signal $V_H$ via an AND gate (logical product). Thereby, a pulse signal line $V_H$, which has constant amplitude and constant delay time $\tau$, is formed, as illustrated in FIG. 8.

The pulse signal line $V_H$ is integrated by a LPF 25, and is converted into a voltage value $V_I$ corresponding to frequency.

Further, the voltage value $V_I$ is compared with a reference voltage 17 ($V_{REF}$). An output signal of the $V_I$ amplifier 15 is supplied as a reference voltage of the comparator 23a, 23b.

With such a structure, when the control signal $S_{18}$ is put into "L" (low level), the switch 32 selects the output of the adder 32. Consequently, the VI amplifier 15 is put into an off-state (namely, an output terminal is opened). Consequently, electric charge (threshold level $V_{TH16}$) of the capacitor 16 is retained or kept.

On the other hand, when the control signal $S_{18}$ is put into "H" (high level), the switch 32 selects the output signal of the local oscillator 32. As a result, the VI amplifier 15 is put into an on-state. Thereby, feedback in the delay detection portion 14 is activated.

As mentioned above, the signal $V_A$ from the delay detection portion 14 is removed the amplitude modulation components thereof by the limiter amplifier 19, and is converted into the signals $V_B$ and $V_C$. In this event, the signals $V_B$ and $V_C$ have phases reverse to each other.

Subsequently, the output signals $V_B$ and $V_C$ are converted into signals $V_D$ and $V_E$ by the common-emitter transistors 21a and 21b, and further, converted into signals $V_F$ and $V_G$ by the comparators 23a and 23b. Herein, it is to be noted that each of the comparators 23a and 23b has the threshold level $V_{TH16}$.

Further, the signals $V_F$ and $V_G$ are converted into a signal $V_H$ by via the AND gate. Thereby, pulse signal line $V_H$ having the constant amplitude and the constant delay time $\tau$ is formed, as described before.

Finally, the pulse signal line $V_H$ is integrated by the LPF 25, and is converted into the voltage value $V_I$ corresponding to the frequency of the signal $V_A$.

The voltage value $V_I$ is compared with the reference voltage $V_{REF}$. As a result of the comparison, when the voltage value $V_I$ is higher than the reference voltage $V_{REF}$, the output of the VI amplifier 15 is put into "L". Thereby, electric charge off the capacitor 16 is discharged. In consequence, the threshold level $V_{TH16}$ is lowered or reduced.

On the other hand, when the voltage value $V_I$ is lower than the reference voltage $V_{REF}$, the output of the VI amplifier 15 is put into "H". Thereby, electric charge of the capacitor 16 is charged. Thereby, the threshold level $V_{TH16}$ is increased.

In the first embodiment, the delay time $\tau$ is adjusted on the condition that the control signal $S_{18}$ is put into "H". Thereby, the voltage value $V_I$ from the delay detection portion 14 is converged to the reference voltage $V_{REF}$. In this event, frequency given to the delay detection portion 14 is equal to center frequency of a second FSK signal.

On the other hand, when the control signal $S_{18}$ is put into "L", a normal receiving state appears. In this case, frequency given to the delay detection portion 14 is equal to the second FSK signal. Therefore, the control signal $S_{18}$ is put into "H" during signal receiving wait state or during signal receiving state unnecessary to receive a signal.

The above-mentioned delay time $\tau$ is inversely proportional to current variation of the constant current source 20a, 20b. Further, the delay time $\tau$ is proportional to variation of static capacitance of the capacitor 22a, 22b, and is proportional to the threshold voltage $V_{TH16}$ as the reference voltage given to the comparator 23a, 23b.

In this embodiment, when the voltage value $V_I$ is higher than the reference voltage $V_{REF}$, the delay time $\tau$ becomes higher than a value to be essential. In this case, the VI amplifier 15 discharges electric charge of the capacitor 16 so as to reduce $V_{TH16}$. Thereby, the delay time $\tau$ becomes low. In consequence, the voltage value $V_I$ is reduced, and the voltage value $V_I$ is finally is converged to $V_{REF}$.

On the other hand, when the voltage value $V_I$ is lower than the reference voltage $V_{REF}$, the delay time $\tau$ becomes lower than the value to be essential. In this event, the VI amplifier 15 charges electric charge of the capacitor 16 so as to increase $V_{TH16}$. Thereby, the delay time $\tau$ becomes high. Consequently, the voltage value $V_I$ is increased, and the voltage value $V_I$ is finally is converged to $V_{REF}$.

Figure 9:
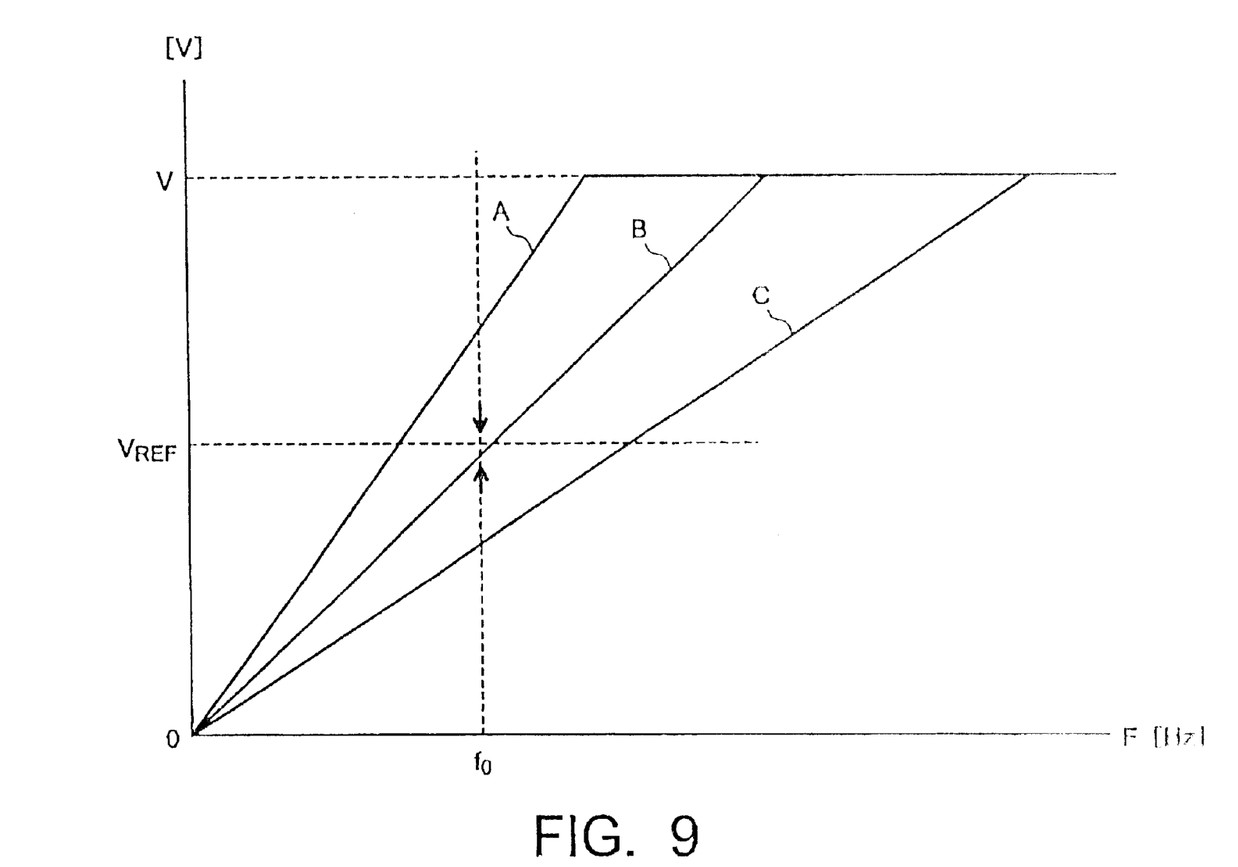
FIG. 9 is a characteristic diagram showing difference of F-V conversion characteristic (demodulation sensitivity) due to difference of threshold level $V_{TH16}$.

In FIG. 9, F-V conversion characteristic (demodulation sensibility) is illustrated in accordance with difference of the threshold levels $V_{TH16}$.

Herein, it is to be noted that each straight line A, B and C in FIG. 9 corresponds to each level A, B and C illustrated in FIG. 8.

The voltage value $V_I$ is equal to a voltage corresponding to center frequency of the second FSK signal. Therefore, the voltage corresponding to the center frequency is compatible with the reference voltage $V_{REF}$. Thereby, variation of the demodulation sensibility is substantially eliminated, and the F-V conversion characteristic is corrected as the straight line B illustrated in FIG. 9.

When the receiving sate becomes normal by putting the control signal $S_{18}$ into "L", the reference voltage $V_{REF}$ is used as reference voltage of a comparator or an A/D (Analog/Digital) converter given with the voltage VI, and thereby, corresponds to center frequency of accurate second FSK signal.

Second Embodiment

Figure 10:
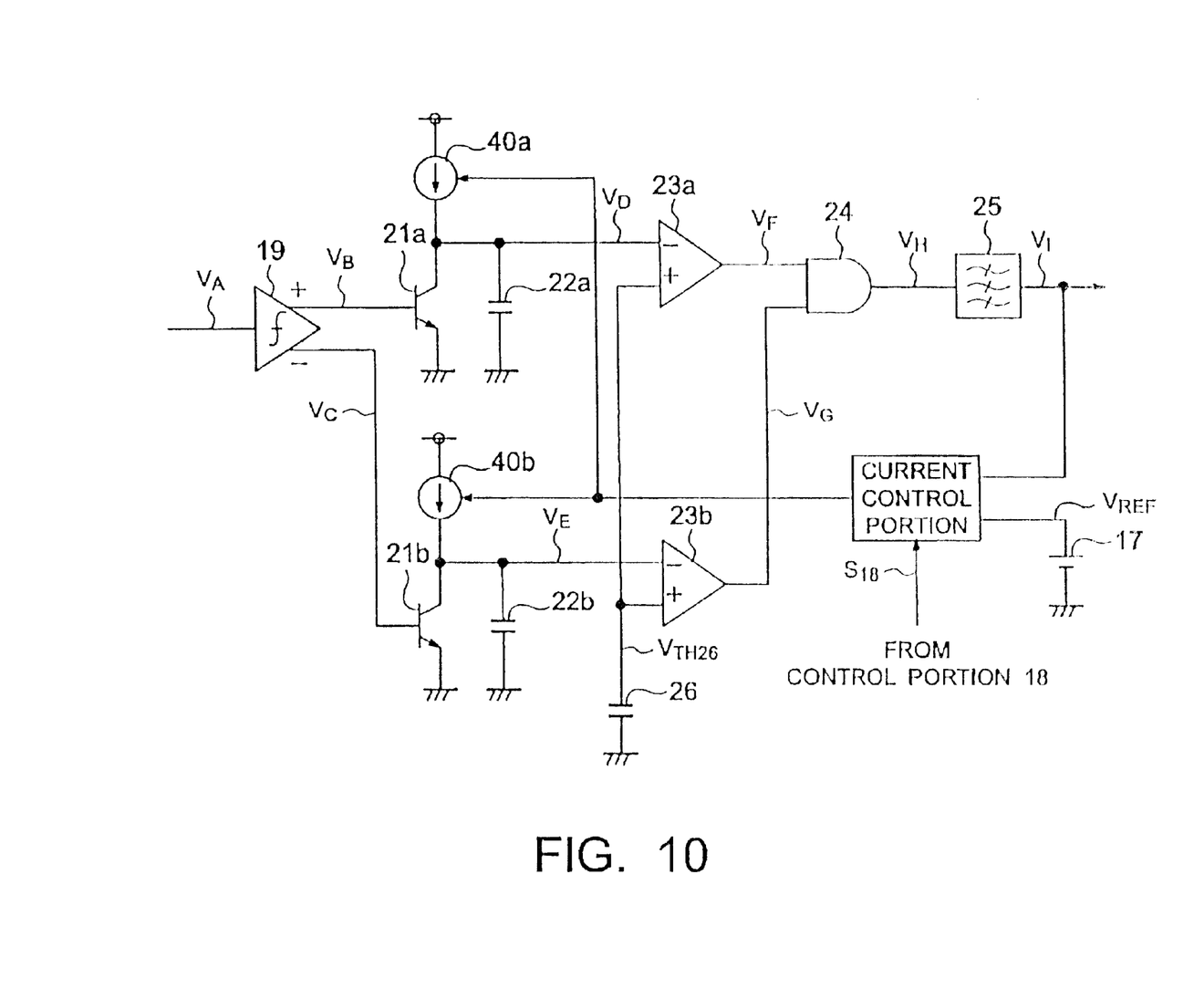
FIG. 10 is a connection diagram showing a detail structure of a delay detection portion 14 in frequency-voltage conversion circuit according to a second embodiment of this invention.

Referring to FIG. 10, description will be made about a second embodiment of this invention. Herein, it is to be noted that the same reference numeral is attached to the same portion as each portion illustrated in FIG. 7.

In the second embodiment, a current control portion 27 is controlled by the use of a control signal $S_{18}$ from the control portion 18. The current control portion 27 compares the voltage value $V_I$ with the reference voltage $V_{REF}$, and controls constant current sources 40a and 40b on the basis of the comparing result via the feedback.

With such a structure, when the control signal $S_{18}$ is put into "L" (low level), current value of the constant current source 40a, 40b is kept to a constant value. On the other hand, when the control signal $S_{18}$ is put into "HH" (high level), the output of the local oscillator 13 selected by the switch 32 is given thereto. Thereby, the current control portion 27 is put into an on-state. Consequently, the feedback becomes active.

In this event, a signal $V_A$ is removed amplitude modulation components thereof by the limiter amplifier 19, and is converted into signals $V_B$ and $V_C$. The signals $V_B$ and $V_C$ are given with desired slopes corresponding to current values determined by constant current sources 40a and 40b, and are converted into signals $V_D$ and $V_E$.

Further, the signals $V_D$ and $V_E$ are converted into signals $V_F$ and $V_G$ by comparators 23a and 23b. In this event, each of the comparators are given with threshold level $V_{TH26}$.

Figure 11:
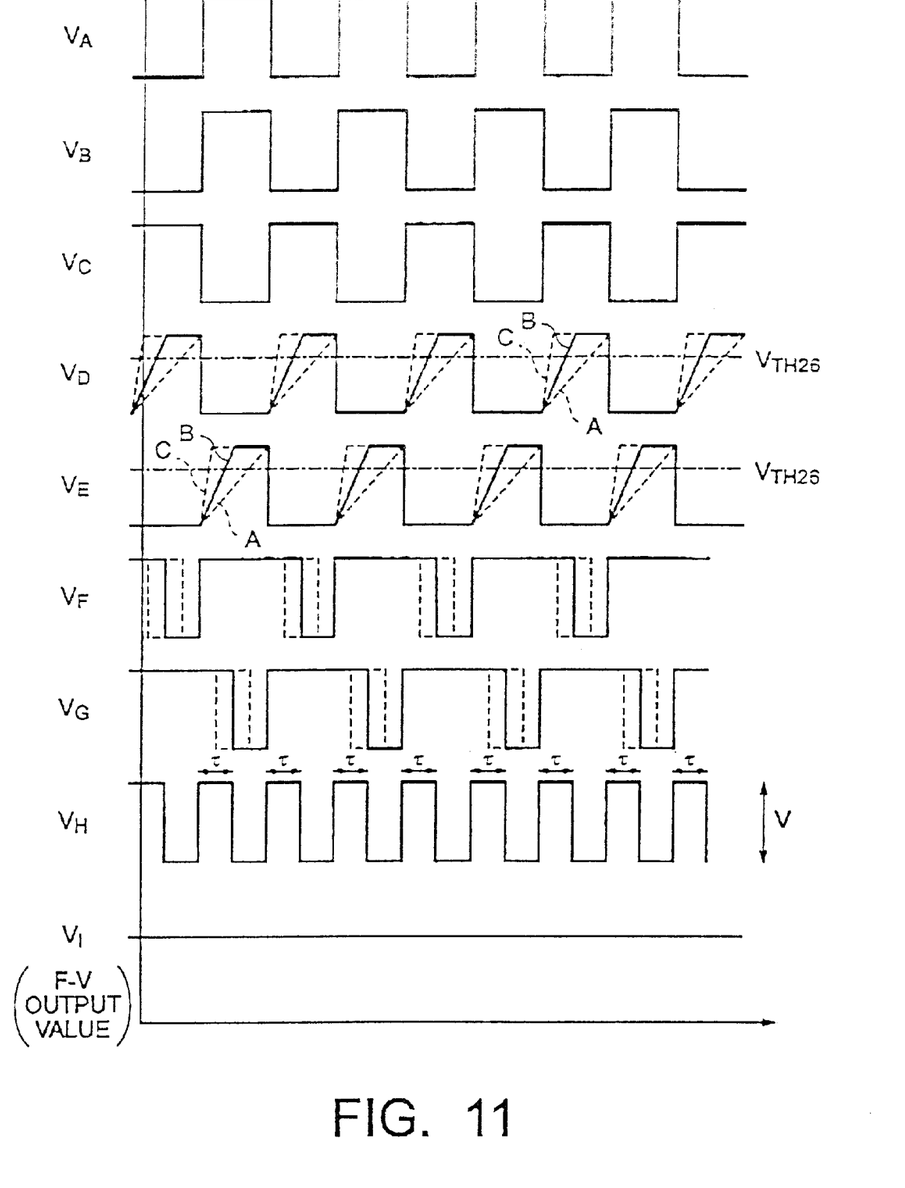
FIG. 11 is a timing chart showing change (waveform) of each signal of each portion in the delay detection portion illustrated in FIG. 10.

Further, logic product (negative logic product) is carried out for the signals $V_F$ and $V_G$ through an AND gate 24. Thereby, pulse signal line $V_H$ is generated, as illustrated in FIG. 11.

In the pulse signal line $V_H$, amplitude and delay time τ are constantly kept. This signal line $V_H$ is integrated by a LPF 25, and is converted into voltage value $V_I$ corresponding to the frequency of the signal $V_A$.

In this case, the voltage value $V_I$ is compared with the reference voltage $V_{REF}$. As the result of the comparison, when the voltage value $V_I$ is higher than the reference voltage $V_{REF}$, the current control portion 27 controls so as to increase current value of the constant current source 40a, 40b.

On the other hand, when the voltage value $V_I$ is lower that the reference voltage $V_{REF}$, the current control portion 27 controls so as to reduce the current value of the constant current source 40a, 40b.

More specifically, when the control signal $S_{18}$ is put into "H" (namely, the feedback is in an active state), the delay time τ is adjusted. Further, the F-V converted voltage value $V_I$ is converged into the reference voltage $V_{REF}$. On the other hand, when the control signal $S_{18}$ is put into "L", normal receiving state appears.

Therefore, the control signal $S_{18}$ is put into "H" so as to perform the feedback during signal receiving wait state or during signal receiving state unnecessary to receive a signal.

The delay time τ is inversely proportional to variation of the current value of the constant current source 40a, 40b, and is proportional to static capacitance of the capacitor 22a, 22b. Further, the delay time τ is proportional to the threshold level $V_{TH26}$ given to the comparator 23a, 23b.

In this embodiment, when the voltage value $V_I$ is higher than the reference voltage $V_{ERF}$, the delay time τ is becomes larger than a value to be essential. In such a case, the current control portion 27 controls so as to increase the current value of the constant current source 40a, 40b. Thereby, the voltage value $V_I$ becomes low, and the voltage value $V_I$ finally converges into $V_{REF}$.

On the other hand, when the voltage value $V_I$ is lower than the reference voltage $V_{ERF}$, the delay time τ is becomes lower than the value to be essential. In this case, the current control portion 27 controls so as to reduce the current value of the constant current source 40a, 40b. Thereby, the voltage value $V_I$ becomes large, and the voltage value $V_I$ finally converges into $V_{REF}$.

Herein, it is to be noted that the voltage value $V_I$ is a voltage which corresponds to center frequency of the second FSK signal. Therefore, the voltage corresponding to the center frequency is made to be compatible with the referential voltage $V_{REF}$. Thereby, variation of demodulation sensibility is substantially eliminated. Further, the F-V conversion characteristic is corrected as the straight line B illustrated in FIG. 9.

When the control signal $S_{18}$ is put into "L" and is in the normal receiving state, the reference voltage $V_{REF}$ is used as the reference voltage of a comparator or a A/D converter which is supplied with the voltage value $V_I$, and thereby, accurately corresponds to the center frequency of the second FSK signal.

What is claimed is:

1. A frequency-voltage conversion circuit, comprising:

integrating means which gives a predetermined slope for rising, or falling of a rectangular pulse signal;

first comparing means which compares an output value of the integrating means with a threshold value and which produces a pulse signal line having a pulse width corresponding to frequency of the rectangular pulse signal;

storing means which stores and retains the threshold value;

smoothing means which smooths the pulse signal line and which produces a voltage value corresponding to the frequency of the rectangular pulse signal; and second comparing means which compares the voltage value with a reference voltage and which charges and discharges electric charge for the storing means on the basis of the comparison result.

2. A circuit as claimed in claim 1, wherein:

the integrating means comprises;

a constant current device which produces constant current, and a static capacitance device which stores the current.

3. A circuit as claimed in claim 1, wherein:

the second comparing means discharges the electric charge from the storing means when the voltage value is higher than the reference voltage.

4. A circuit as claimed in claim 1, wherein:

the second comparing means charges electric charge for the storing means when the voltage value is lower than the reference voltage.

5. A frequency-voltage conversion circuit, comprising:

integrating means which gives a predetermined slope for rising or falling of a rectangular pulse signal comprising a constant current device which restricts current to a predetermined value, and a static capacitance device which stores the current;

comparing means which compares an output value of the integrating means with a threshold value and which produces a pulse signal line having a pulse width corresponding to frequency of the pulse signal;

smoothing means which smoothes the pulse signal line and which produces a voltage value corresponding to the frequency of the rectangular pulse signal; and a current control portion which compares the voltage value with a reference voltage and which changes the slope of the rising or the falling of the rectangular pulse signal on the basis of the comparison result.

6. A circuit as claimed in claim 5, wherein:

the current control portion compares the voltage value with the reference voltage and changes current restricting value by the constant current device on the basis of the comparison result.

7. A circuit as claimed in claim 6, wherein:

the current control portion increases the current restricting value by the constant current device when the voltage value is higher than the reference voltage.

8. A circuit as claimed in claim 6, wherein:

the current control portion reduces the current restricting value by the constant current device when the voltage value is lower than the reference voltage.

* * * * *